Dec. 27, 1966 W. E. DU VALL 3,294,958

ANALOG-TO-DIGITAL CONVERTER

Filed July 13, 1962

WILBUR E. DU VALL
INVENTOR.

BY Lyon & Lyon

ATTORNEYS

3,294,958
ANALOG-TO-DIGITAL CONVERTER

Wilbur E. Du Vall, Gardena, Calif., assignor, by mesne assignments, to The Electrada Corporation, Los Angeles, Calif., a corporation of Delaware Filed July 13, 1962, Ser. No. 209,718
5 Claims. (Cl. 235—92)

This invention relates to analog-to-digital converter circuits and, more particularly, to improvements therein.

An object of the present invention is the provision of a novel analog-to-digital converter circuit.

Another object of the present invention is the provision of an analog-to-digital converter circuit which is operative over a range of analog inputs which is substantially larger than those heretofore available.

Still another object of the present invention is the provision of a simple, wide-range analog-to-digital converter circuit.

These and other objects of the invention are achieved in an arangement wherein the output from a crystal oscillator is applied to a frequency discriminator and to a balanced modulator. Another input to the balanced modulator is the output of a voltage-controlled oscillator. The input to this voltage-controlled oscillator comprises a difference voltage, which is the difference between an analog input voltage and the output of the frequency discriminator. The output of the voltage-controlled oscillator, besides being applied to the balanced modulator, is also applied to the frequency discriminator. The frequency-discriminator output, therefore, is a voltage which is proportional to the difference in frequency between the crystal-oscillator frequency and the voltage-controlled oscillator frequency. This is applied to a summing network, to be combined with an analog input voltage. The voltage-controlled oscillator responds to the summing-network output, which is a difference voltage. The balanced-modulator output comprises a signal whose frequency is the difference between the crystal oscillator and the output of the voltage-controlled oscillator. The balanced-modulator output is applied to a low-pass filter, the output of which is applied through a gate to a counter. The counter counts the number of oscillations which occur over an interval which is determinable by another counter. This other counter is a time-base counter. It is driven by the original crystal-oscillator output.

The purpose of the frequency discriminator is to provide a negative-feedback voltage which linearizes the output of the voltage-controlled oscillator. The purpose of the balanced modulator is to detect the difference in frequency between the crystal oscillator and the voltage-controlled oscillator outputs, and this difference in frequency is counted by the counter.

The novel features that are considered characteristic of this invention are set forth with particularity in the appended claims. The invention itself, both as to its organization and method of operation, as well as additional objects and advantages thereof, will best be understood from the following description when read in connection with the accompanying drawings, in which:

Figure 1:
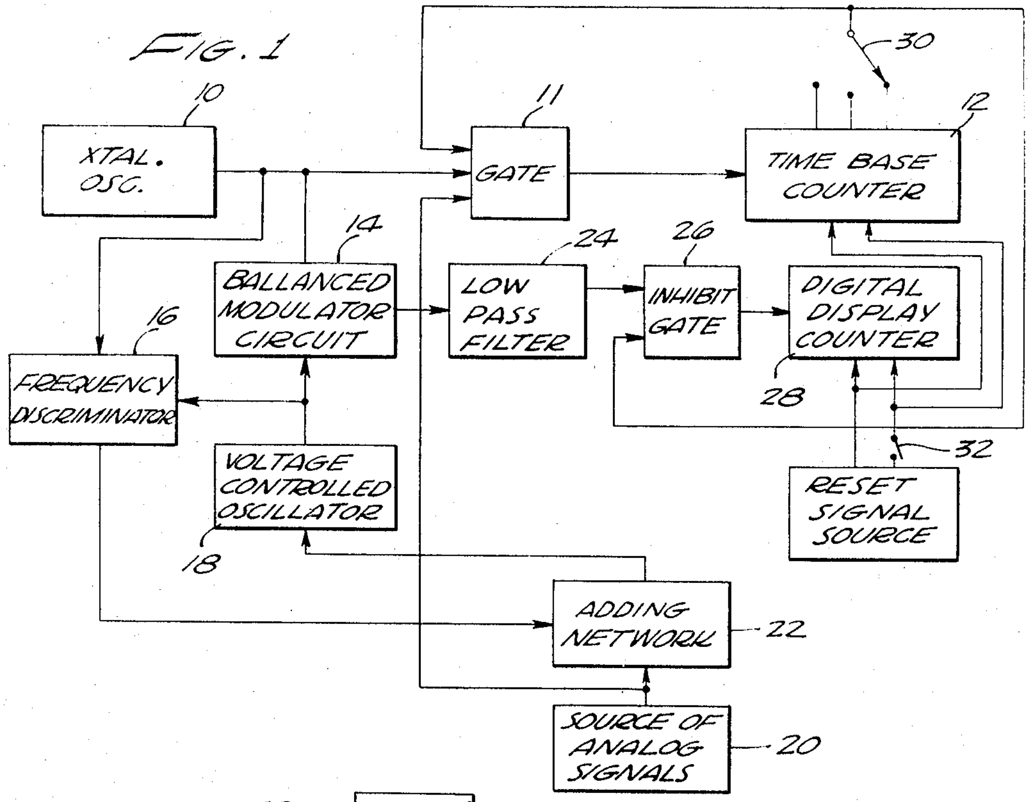
FIGURE 1 is a block diagram of the embodiment of the invention.
Figure 2:
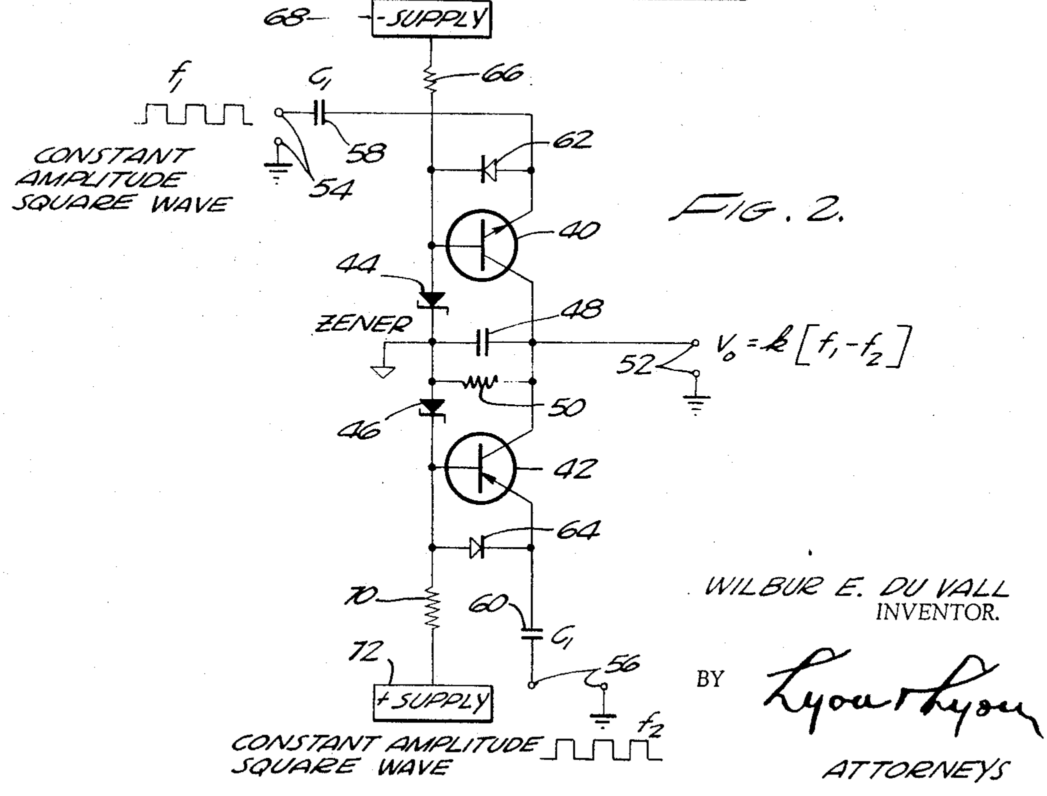
FIGURE 2 is a circuit diagram of a frequency-discriminator circuit which is suitable for use in the embodiment of the invention.

Reference is now made to FIGURE 1, which is a block diagram of the embodiment of the invention. This comprises a crystal oscillator 10, which is oscillating at a suitable frequency, such as 100 kilocycles per second. The output of the crystal oscillator 10 is applied to coincidence gate 11, to a balanced-modulator circuit 14, and to a frequency-discriminator circuit 16. Gate 11 is opened in the presence of an analog signal from a source 20. The output of gate 11 is applied to a time-base counter 12. The balanced-modulator circuit may be any of the well-known types of balanced-modulator circuits which are used for the purpose of producing as its output a signal which is the difference between the frequencies of the two inputs to the balanced-modulator circuit. The details of the circuit for the frequency discriminator 16 are shown in FIGURE 2.

The second input to the balanced-modulator circuit and also to the frequency-discriminator circuit comprises the output of a voltage-controlled oscillator 18. The voltage-controlled oscillator circuit is a circuit well known in the art which operates at a predetermined frequency which changes a proportional amount in response to the amplitude of an input signal.

A source of analog signals 20 applies signals, whose amplitude is to be converted to digital values, to an adding network 22. The analog signals are combined by the adding network with the output of the frequency dicriminator circuit 16. The resultant comprises the difference between the two signals, and this difference is applied to the voltage-controlled oscillator to cause it to deviate in a positive or negative direction from its predetermined reference frequency. When no signals are received from the source of analog signals, the output of the frequency discriminator 16 will comprise a voltage whose level is determined solely by the frequency of the crystal oscillator 10. This voltage is applied to the adding network, and, from the adding network, to the voltage-controlled oscillator. The voltage-controlled oscillator output, in response to the signal received at this time, is a signal having a frequency which is substantially identical with the frequency of the crystal oscillator. Accordingly, the balanced modulator will not provide any output. This situation obtains until a signal, positive or negative, is received from the source of analog signals. This will cause a corresponding change in the output-signal frequency of the voltage-controlled oscillator, and the balanced-modulator circuit will detect this change in frequency. The output of the balanced-modulator circuit, consisting of a signal whose frequency is the difference of its inputs, is applied to a low-pass filter 24. The output of the low-pass filter is applied to a gate circuit 26. The output of the gate circuit is applied to a counter 28, which will count the cycles of the difference frequency, which are applied to its input.

In order to provide a suitable time base so that the counter 28 may be controlled to provide a digital indication of the analog input, gate 11 and the time base counter 12 are employed. When an analog signal is to be digitalized, it is used to open the gate 11. As a result, the time-base counter is driven by the output of the crystal oscillator 10. A selector switch 30 is employed to connect to any one of the count outputs of the time-base counter 12. When the time-base counter 12 has attained the selected count, the output is applied to the gate 26, to inhibit or close this gate, whereby counter 28 no longer advances, and, by its output, manifests a digital indication of the amplitude of the input-analog signal. The selected output of the time-base counter is also used to inhibit gate 11 to prevent the time-base counter from advancing after it attains the preselected count.

The selection of the count at which the gate 26 is closed may be employed so that the range of this analog-to-digital converter is extendable for input analog voltages from 100 millivolts up to 10 volts. The higher the input voltage, the shorter the time base, or the lower the count which is selected. The lower the input voltage, the greater the time base required, or the greater the count selected for the counter 12. The function of the frequency discriminator 16 is to provide a reference level for the voltage-controlled oscillator 18, from which it may deviate for positive-or negative-polarity analog voltages. It also provides a negative feedback voltage for the purpose of linearizing the response of the voltage-controlled oscillator 18 to the analog-input voltages.

To initiate operation of the invention, it first is necessary to reset the two counters. This may be done by closing a switch 32 to apply a reset signal from the reset-signal source 34 to both counters.

Reference is now made to FIGURE 2, which is a circuit diagram of a frequency-discriminator circuit suitable for employment with this invention. This preferred discriminator circuit comprises a first and second transistor, respectively 40 and 42. The base of the first transistor 40 is connected through a Zener diode 44 to ground. The base of the second transistor 42 is connected through a Zener diode 46 to ground. A capacitor 48, parallel with the resistor 50, is connected between the connected-together collectors of the transistors 40 and 42 to ground. Output is derived from these connected-together collectors and is applied to a pair of terminals 52.

The input to the discriminator circuit from the crystal oscillator 10 is applied to a first pair of input terminals 54. The input to the discriminator from the voltage-controlled oscillator is applied to a second pair of input terminals 56. One of each of these input terminals is connected to ground. The other of the input terminals 54 is connected a capacitor 58 to the emitter of the transistor 40. The other of the input terminals 56 is connected through a capacitor 60 to the emitter of the transistor 42. The collector of transistor 40 is coupled to its base through a diode 62. The collector of the transistor 42 is connected to its base through a diode 64.

A resistor 66 connects the base of transistor 40 to a source of negative potential 68. A resistor 70 connects the base of transistor 40 to a source of positive potential 72. As a result of the interconnection to the positive and negative sources, the junction of the diodes 44 and 46 and of the resistor 50 and capacitor 48 is essentially at ground potential.

It is required for the proper operation of this circuit that the input capacitors, respectively 58, 60, be very much smaller than the value of the capacitor 48—on the order from 100 to 1,000 times smaller. Now, consider the operation of the circuit in response to a single-input frequency, for example, the output of the crystal oscillator 10. In the presence of the oscillations, transistor 40 is driven conductive on negative swings of the input signal. Capacitor C1 charges up, and the output of transistor 40 serves to charge up the capacitor 48. On each half cycle, the charge is removed from capacitor C1. Similarly, in the presence of a signal from the voltage-controlled oscillator, capacitor C1 is charged up on positive transitions of the input oscillations, and these are applied to transistor 42 to render it conductive. When transistor 42 is rendered conductive, since it is of the opposite impurity type to transistor 40, it will operate to reduce the voltage which is present on capacitor 48, due to the operation of transistor 40. As a result, capacitor 48 will store a charge proportional to the difference in frequency between the two input signals. The resultant voltage is applied to the output terminals 52. The resistor 50 serves to enable capacitor 48 to discharge in the absence of any input signal thereto. The voltage which is stored by capacitor 48 is applied to the adding network 22, where, in the absence of an analog signal, the voltage-controlled oscillator is made to oscillate at the frequency of the crystal oscillator 10. In the presence of an analog signal, the operation of the arrangement is as has been previously described.

There has accordingly been described hereinabove a novel, useful, and simple analog-to-digital converter circuit. In an embodiment of the invention which was built, by way of illustration of its capabilities, the system easily handled a range of input-analog signals from 100 millivolts up to 10 volts and provided an accurate digital-output indication thereof. Not only has the circuit wide-range handling capabilities, but, also, it can handle input voltages of either polarity with equal facility.

I claim:

1. Apparatus for converting a voltage from an analog signal source to a digital representation thereof comprising an oscillation generator, a voltage-controlled oscillator, means for applying the output from said source of analog signals to said voltage-controlled oscillator to control the frequency of oscillations of said voltage-controlled oscillator, means for combining the output of said oscillation generator and said voltage-controlled oscillator to derive a resultant signal having a frequency equal to the difference between the output of said two oscillators, a counter, and means to apply said resultant signal to said counter for a predetermined interval whereby the count output of said counter is a digital indication of the signal applied to said voltage-controlled oscillator from said source of analog signals, wherein said means to apply said resultant signal to said counter for a predetermined interval comprises a time-base counter, means for applying output from said oscillation generator to said time-base counter for a predetermined interval, means for selecting an output from said time-base counter, a gate circuit having its input connected to receive said resultant signal from said means for combining output and its output connected to said counter to apply said resultant signal thereto, and means for applying the selected output of said time-base counter to said gate to close it to prevent any further application of said resultant signal to said counter.

2. Apparatus for converting analog signals from a source to a digital manifestation thereof, comprising a source of oscillation at a predetermined frequency, an adding network, a voltage-controlled oscillator, a frequency discriminator, means for applying the output of said voltage-controlled oscillator and said source of oscillations to said frequency discriminator to produce as an output thereof a signal repersentative of the difference in the frequency of the two inputs, means for applying the output of said frequency discriminator and an analog signal from said source to said adding network to produce as an output a control signal which is the resultant of the two inputs, means for applying said control signal to said voltage-controlled oscillator to vary the frequency of the output of said voltage-controlled oscillator responsive to said control signal, means to which said voltage-controlled oscillator output and said oscillation-generator output is applied for producing a resultant signal having a frequency which is the difference of the two input-signal frequencies, and means to which the difference-frequency signal is applied for providing a digital indication representative thereof.

3. In an analog-to-digital conversion system of the type wherein the amplitude of an analog signal is represented by the frequency of a signal to which said analog signal is converted, the improvement in the apparatus for generating said representative signal comprising a reference-oscillation generator, a voltage-controlled oscillator, means for establishing the output of said voltage-controlled oscillator at the frequency of said reference-oscillation-generator output when no control voltage is applied to its input including a frequency discriminator circuit for providing an output signal which has an amplitude representative of the difference in frequency of its inputs, means for applying the output of said reference oscillator and said voltage-controlled oscillator to said frequency-discriminator circuit, an adding network, means for applying the output of said frequency discriminator to said adding network, means for applying the output of said adding network to said voltage-controlled oscillator, and means for applying analog signals to said adding network to be combined with the output of said frequency discriminator.

4. An analog-to-digital converter including:

first means for producing a first signal having a reference frequency;

second means responsive to an analog signal for producing a second signal having a frequency in accordance with the amplitude of the analog signal;

third means operatively coupled to the first and second means and responsive to the first and second signals for producing a third signal having a frequency in accordance with a combination of the frequencies of the first and second signals;

fourth means operatively coupled to the first and second means and responsive to the first and second signals for stabilizing the operation of the second means in accordance with the differing values of the analog signal; and fifth means operatively coupled to the third means and responsive to the third signal for producing a digital signal in accordance with the frequency of the third signal.

5. An analog-to-digital converter including:

first means for producing a first signal having a reference frequency;

second means responsive to an analog signal for producing a second signal having a frequency in accordance with the amplitude of the analog signal;

third means operatively coupled to the first and second means and responsive to the first and second signals for producing a third signal having a frequency in accordance with a combination of the frequencies of the first and second signals;

fourth means operatively coupled to the first and second means and responsive to the first and second signals for controlling the production of the second signal in accordance with the difference between the frequencies of the first and second signals; and fifth means operatively coupled to the third means and responsive to the third signal for producing a digital signal in accordance with the frequency of the third signal.

References Cited by the Examiner

UNITED STATES PATENTS

| | | | |
|---|---|---|---|
| 2,539,673 | 4/1944 | Peterson | 235—92 |
| 2,835,868 | 5/1958 | Lindesmith | 340—347.1 |
| 2,905,895 | 9/1959 | Gordon | 340—347 |
| 2,950,471 | 8/1960 | Hoeppner | 340—347 |
| 2,986,728 | 5/1961 | Hinkley | 343—5 |
| 2,989,741 | 6/1961 | Gordon et al. | 340—347 |

MAYNARD R. WILBUR, *Primary Examiner.*

MALCOLM A. MORRISON, DARYL W. COOK, *Examiners.*

J. F. MILLER, *Assistant Examiner.*